(12) United States Patent  
Takenaga et al.

(10) Patent No.: US 12,165,892 B2
(45) Date of Patent: Dec. 10, 2024

(54) CONTROL DEVICE, SYSTEM AND CONTROL METHOD

(71) Applicant: Tokyo Electron Limited, Tokyo (JP)

(72) Inventors: Yuichi Takenaga, Yamanashi (JP); Takahito Kasai, Iwate (JP); Youngtai Kang, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 513 days.

(21) Appl. No.: 17/369,122

(22) Filed: Jul. 7, 2021

(65) Prior Publication Data

US 2022/0020618 A1 Jan. 20, 2022

(30) Foreign Application Priority Data

Jul. 14, 2020 (JP) ................................. 2020-120754

(51) Int. Cl.
*H01L 21/67* (2006.01)

(52) U.S. Cl.
CPC .. *H01L 21/67253* (2013.01); *H01L 21/67248* (2013.01); *H01L 21/67259* (2013.01); *H01L 21/67288* (2013.01)

(58) Field of Classification Search
CPC ......... H01L 21/67253; H01L 21/67248; H01L 21/67259; H01L 21/67288; G05B 2219/37224; G05B 19/41875; Y02P 90/02; C23C 16/52
See application file for complete search history.

(56) References Cited

U.S. PATENT DOCUMENTS

| | | | |
|---|---|---|---|
| 2013/0217242 A1* | 8/2013 | Noda | .................... C23C 16/402 |
| | | | 118/728 |
| 2017/0278699 A1* | 9/2017 | Kasai | ................ C23C 16/45544 |
| 2018/0286720 A1* | 10/2018 | Takenaga | ............ B05C 11/1005 |

FOREIGN PATENT DOCUMENTS

| | | |
|---|---|---|
| JP | 2013-153142 A | 8/2013 |
| JP | 2016-157771 A | 9/2016 |
| JP | 2017-098464 A | 6/2017 |
| JP | 2017-174983 A | 9/2017 |
| JP | 2017-183311 A | 10/2017 |
| JP | 2018-166191 A | 10/2018 |

* cited by examiner

*Primary Examiner* — Charles Cai
(74) *Attorney, Agent, or Firm* — Venjuris, P.C.

(57) ABSTRACT

A control device includes a reception unit configured to receive a film characteristic at a plurality of positions of a film formed on a substrate by a film forming processing based on a processing recipe, an optimization processing unit configured to execute an optimization calculation of the processing recipe based on the film characteristic, a diagnosis unit configured to diagnose a validity of an in-plane shape of the film characteristic based on the film characteristic, and a determination unit configured to determine whether or not to notify a user of an encouraging action based on a diagnosis result by the diagnosis unit.

14 Claims, 6 Drawing Sheets

CONTROL DEVICE, SYSTEM AND CONTROL METHOD

CROSS-REFERENCE TO RELATED APPLICATIONS

This application is based on and claims priority from Japanese Patent Application No. 2020-120754, filed on Jul. 14, 2020 with the Japan Patent Office, the disclosure of which is incorporated herein in its entirety by reference.

TECHNICAL FIELD

The present disclosure relates to a control device, a control system, and a control method.

BACKGROUND

There has been a technique to calculate a temperature or pressure which becomes a target heat treatment result using a heat treatment change model (see, e.g., Japanese Patent Laid-Open Publication Nos. 2016-157771 and 2017-098464). Further, there has been a technique to calculate film forming conditions that satisfy target film characteristics using a process model which indicates the influence of film forming conditions on film characteristics (see, e.g., Japanese Patent Laid-Open Publication No. 2017-174983).

SUMMARY

A control device according to an aspect of the present disclosure includes a reception unit configured to receive a film characteristic at a plurality of positions of a film formed on a substrate by a film forming processing based on a processing recipe, an optimization processing unit configured to execute an optimization calculation of the processing recipe based on the film characteristic, a diagnosis unit configured to diagnose a validity of an in-plane shape of the film characteristic based on the film characteristic, and a determination unit configured to determine whether or not to notify a user of an encouraging action based on a diagnosis result by the diagnosis unit.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
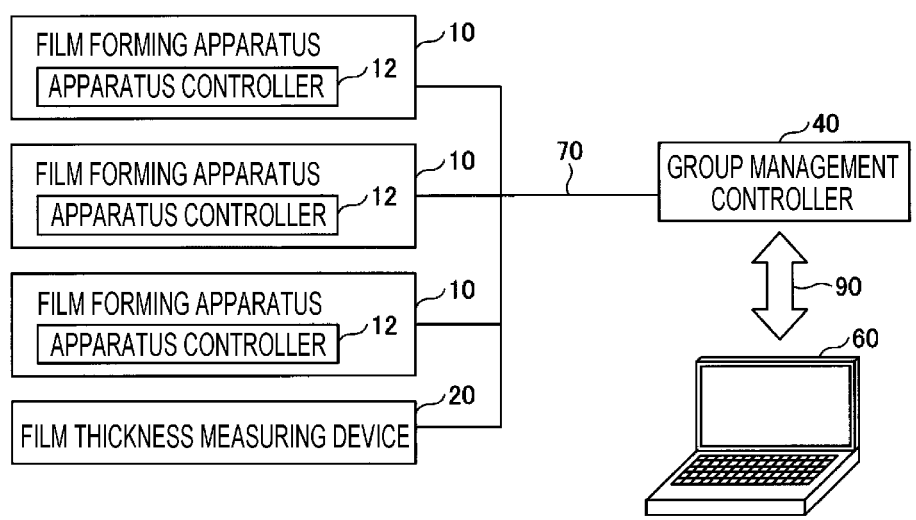
FIG. 1 is a diagram illustrating an example of an overall configuration of a system.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, a non-limiting exemplary embodiment of the present disclosure will be described with reference to the accompanying drawings. Throughout the accompanying drawings, the same or corresponding members or parts will be denoted by the same or corresponding reference numerals, and the redundant descriptions thereof will be omitted.

System

An overall configuration of a system will be described with reference to FIG. 1. FIG. 1 is a diagram illustrating an example of the overall configuration of the system.

A system 1 includes a film forming apparatus 10, a film thickness measuring device 20, a group management controller 40, and a terminal 60. The film forming apparatus 10, the film thickness measuring device 20, and the group management controller 40 are communicatively connected to each other via a network 70. The group management controller 40 is communicatively connected to the terminal 60 via a network 90. Further, the film forming apparatus 10, the film thickness measuring device 20, the group management controller 40, and the terminal 60 may be communicatively connected to a host computer (not illustrated) via a network.

In FIG. 1, the number of film forming apparatuses 10 is three, but the number of film forming apparatuses 10 may be two or less, or may be four or more. Further, in FIG. 1, there is one film thickness measuring device 20, but two or more film thickness measuring devices 20 may be provided.

Film Forming Apparatus

The film forming apparatus 10 is a device that executes various film forming processings. The film forming apparatus 10 includes an apparatus controller 12.

The apparatus controller 12 executes various film forming processings in the film forming apparatus 10 by controlling an operation of each unit of the film forming apparatus 10. The apparatus controller 12 may be, for example, a computer.

The film forming apparatus 10 may be, for example, a cluster type device in which a plurality of processing chambers is arranged around a transfer chamber, or may be an in-line type apparatus in which one processing chamber is arranged on one transfer chamber. Further, the film forming apparatus 10 may be, for example, a single wafer type apparatus, a semi-batch type apparatus, or a batch type apparatus. The single wafer type apparatus is, for example, an apparatus in which semiconductor wafers (hereinafter referred to as "wafers") are processed one by one in a processing chamber. The semi-batch type apparatus is, for example, an apparatus in which a plurality of wafers arranged over a rotary table in a processing chamber are revolved by the rotary table to sequentially pass through a region where a raw material gas is supplied and a region where a reactive gas reacting with the raw material gas is supplied, thereby forming a film on the surface of the wafer. The batch type apparatus is, for example, an apparatus in which a wafer boat that holds a plurality of wafers horizontally at a predetermined interval in the height direction is accommodated in a processing chamber, and a processing is performed on the plurality of wafers at once.

Film Thickness Measuring Device

The film thickness measuring device 20 measures the film thickness of a film formed on the wafer based on measurement conditions. The measurement conditions include, for example, conditions for measuring the film thickness at a plurality of positions in the plane of the wafer. The plurality of positions includes, for example, a position near the center in the plane of the wafer, a position near the outer edge, and an intermediate position.

The position near the center is a position including the central position of the wafer, and falls within a range including a position spaced apart from the central position by a first distance. The first distance may be, for example, 10% of the radius of the wafer. For example, in a case of a wafer having a diameter of 300 mm (radius of 150 mm), the position near the center is a position within a circular range from the central position of the wafer to 15 mm.

The position near the outer edge is a position including the outer edge position of the wafer, and falls within a range to a position spaced apart from the outer edge position by a second distance. The second distance may be, for example, 10% of the radius of the wafer. For example, in a case of a wafer having a diameter of 300 mm (radius of 150 mm), the position near the outer edge is a position within a ring-shaped range from the outer edge position of the wafer to 15 mm.

The intermediate position is a position between the central position and the outer edge position. The intermediate position may be, for example, a position within a range between a position spaced apart from the central position of the wafer by a third distance and a position spaced apart from the central position of the wafer by a fourth distance. The third distance may be, for example, 70% of the radius of the wafer.

The fourth distance may be, for example, 90% of the radius of the wafer. For example, in a case of a wafer having a diameter of 300 mm, the intermediate position is a position within a ring-shaped range between a position at 105 mm from the central position of the wafer and a position at 135 mm from the central position of the wafer.

Group Management Controller

Figure 2:
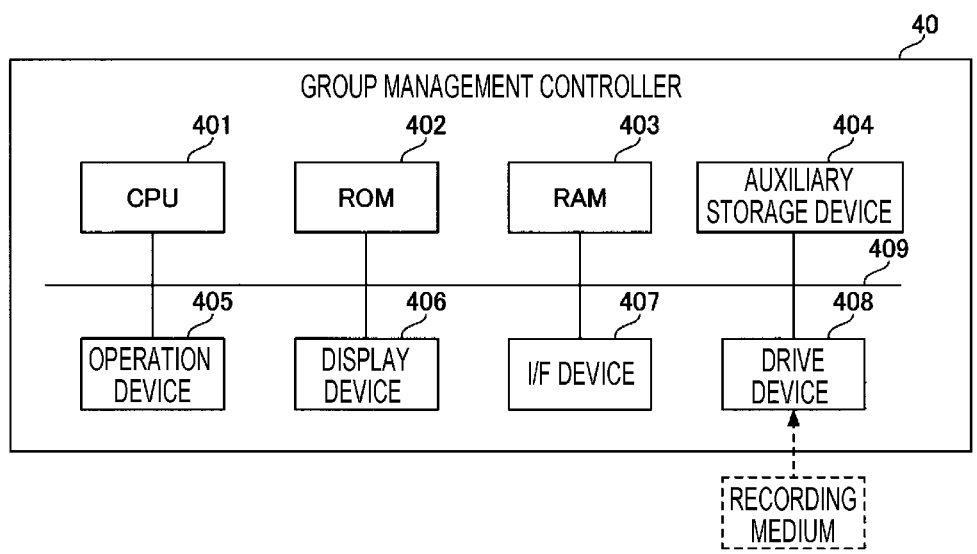
FIG. 2 is a diagram illustrating an example of a hardware configuration of a group management controller.

A hardware configuration of the group management controller 40 will be described with reference to FIG. 2. FIG. 2 is a diagram illustrating an example of the hardware configuration of the group management controller 40.

The group management controller 40 includes a central processing unit (CPU) 401, a read only memory (ROM) 402, and a random access memory (RAM) 403. The CPU 401, the ROM 402 and the RAM 403 constitute a so-called computer.

Further, the group management controller 40 includes an auxiliary storage device 404, an operation device 405, a display device 406, an interface (I/F) device 407, and a drive device 408. Further, these respective hardware components of the group management controller 40 are connected to each other via a bus 409.

The CPU 401 executes various programs installed in the auxiliary storage device 404.

The ROM 402 is a nonvolatile memory, and functions as a main storage device. The ROM 402 stores various programs and information necessary for the CPU 401 to execute various programs installed in the auxiliary storage device 404.

The RAM 403 is a volatile memory such as a dynamic random access memory (DRAM) or a static random access memory (SRAM), and functions as a main storage device. The RAM 403 provides a work area that is expanded when various programs installed in the auxiliary storage device 404 are executed by the CPU 401.

The auxiliary storage device 404 stores various programs and information.

The operation device 405 is an input device used by a user when inputting various instructions to the group management controller 40.

The display device 406 is a display device that displays internal information of the group management controller 40.

The I/F device 40 is a connection device that is connected to the network 70 for communication with the film forming apparatus 10.

The drive device 408 is a device for read and write to and from a recording medium. The recording medium includes, for example, a CD-ROM, a flexible disk, a magneto-optical disk, a ROM, and a flash memory.

Various programs to be installed in the auxiliary storage device 404 are installed, for example, as a distributed recording medium is inserted into the drive device 408 and various programs recorded on the recording medium are read by the drive device 408.

Figure 3:
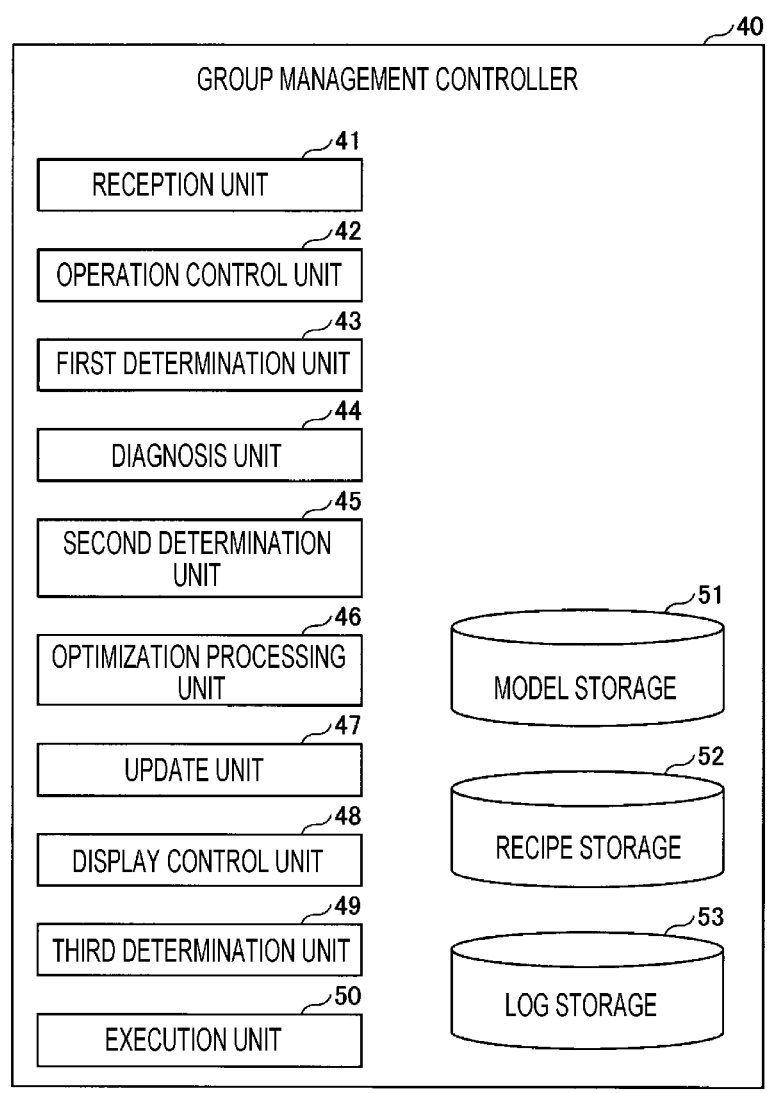
FIG. 3 is a diagram illustrating an example of a functional configuration of the group management controller.

A functional configuration of the group management controller 40 will be described with reference to FIG. 3. FIG. 3 is a diagram illustrating an example of the functional configuration of the group management controller 40.

The group management controller 40 includes a reception unit 41, an operation control unit 42, a first determination unit 43, a diagnosis unit 44, a second determination unit 45, an optimization processing unit 46, an update unit 47, a display control unit 48, a third determination unit 49, an execution unit 50, a model storage 51, a recipe storage 52, and a log storage 53.

The reception unit 41 receives various types of information input from the outside. Various types of information include, for example, necessary information such as a process type, a start command, and a film thickness measurement result measured by the film thickness measuring device 20. The film thickness measurement result includes the result of measuring the film thickness of a film formed on the wafer at a plurality of positions in the plane, and includes, for example, film thickness information in which the in-plane position of the wafer and the measured film thickness value correspond to each other.

The operation control unit 42 controls the film forming apparatus 10 and the film thickness measuring device 20. For example, the operation control unit 42 controls the film forming apparatus 10 so as to execute a film forming processing based on a processing recipe corresponding to the process type received by the reception unit 41. Further, for example, the operation control unit 42 controls the film thickness measuring device 20 so as to measure the film thickness of a film formed on the wafer.

The first determination unit 43 determines whether or not the film thickness measurement result received by the reception unit 41 has reached a target. For example, the first determination unit 43 calculates in-plane uniformity based on the measured film thickness values at a plurality of positions in the plane received by the reception unit 41. Then, the first determination unit 43 determines that the film thickness measurement result has reached a target when the calculated in-plane uniformity is equal to or less than a predetermined value (for example, ±1%). Further, the first determination unit 43 determines that the film thickness measurement result has not reached the target when the calculated in-plane uniformity is greater than the predetermined value (for example, ±1%).

The diagnosis unit 44 diagnoses the validity of the in-plane shape of the film thickness based on the film thickness measurement result received by the reception unit 41. For example, the diagnosis unit 44 diagnoses the validity of the in-plane shape of the film thickness based on a magnitude relation of the measured film thickness values at a plurality of predetermined positions in the plane of the wafer. The plurality of positions includes, for example, positions near the center and near the outer edge in the plane of the wafer. Further, the plurality of positions may include an intermediate position in addition to the position near the center and the position near the outer edge in the plane of the wafer. This is because the intermediate position is one of important indexes in determining whether or not the in-plane uniformity of the film thickness is able to be increased by a recipe optimization calculation to be described later.

FIGS. 4 to 8 are diagrams illustrating an example of a relationship between the in-plane position of the wafer and the film thickness. In FIGS. 4 to 8, the horizontal axis represents the in-plane position [mm] of the wafer, and the vertical axis represents the film thickness. Regarding the in-plane position of the wafer, "0 mm" represents the central position of the wafer, and "−150 mm" and "150 mm" represent the outer edge positions of the wafer.

First, the diagnosis unit 44 determines whether or not the measured film thickness value at the position near the center of the wafer is greater than the measured film thickness value at the position near the outer edge. Subsequently, the diagnosis unit 44 determines whether or not the measured film thickness value at the position near the outer edge is greater than the measured film thickness value at the intermediate position.

Figure 4:
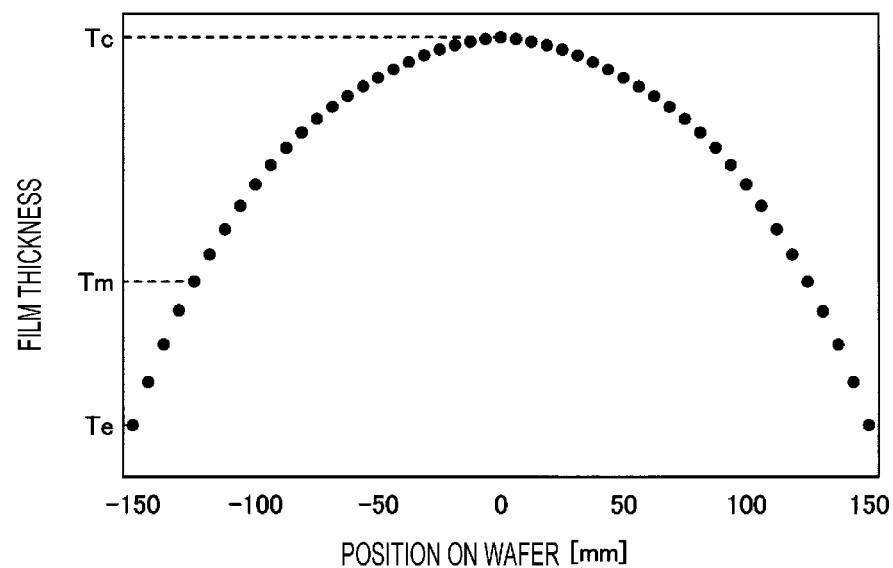
FIG. 4 is a diagram illustrating an example of a relationship between the in-plane position of a wafer and the film thickness.

In a case where the measured film thickness value shows the distribution illustrated in FIG. 4, since the measured film thickness value Tc at the position near the center is greater than the measured film thickness value Te at the position near the outer edge and the measured film thickness value Tm at the intermediate position is greater than the measured film thickness value Te at the position near the outer edge, the diagnosis unit 44 diagnoses that the film thickness has a convex in-plane shape. That is, since the measured film thickness values satisfy the relation of Te<Tm<Tc, the diagnosis unit 44 diagnoses that the film thickness has a convex in-plane shape.

Figure 5:
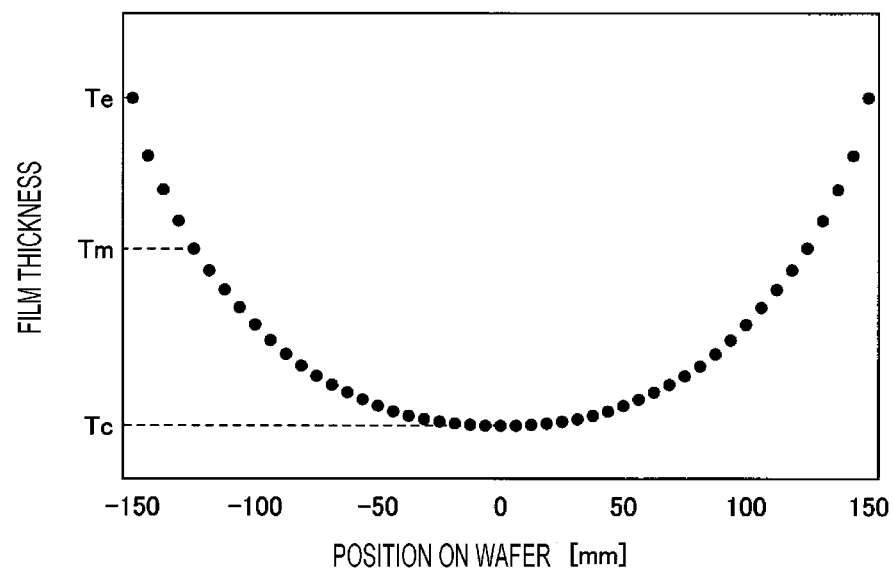
FIG. 5 is a diagram illustrating an example of a relationship between the in-plane position of a wafer and the film thickness.

In a case where the measured film thickness value shows the distribution illustrated in FIG. 5, since the measured film thickness value Tc at the position near the center is less than the measured film thickness value Te at the position near the outer edge and the measured film thickness value Tm at the intermediate position is less than the measured film thickness value Te at the position near the outer edge, the diagnosis unit 44 diagnoses that the film thickness has a concave in-plane shape. That is, since the measured film thickness values satisfy the relation of Tc<Tm<Te, the diagnosis unit 44 diagnoses that the film thickness has a concave in-plane shape.

Figure 6:
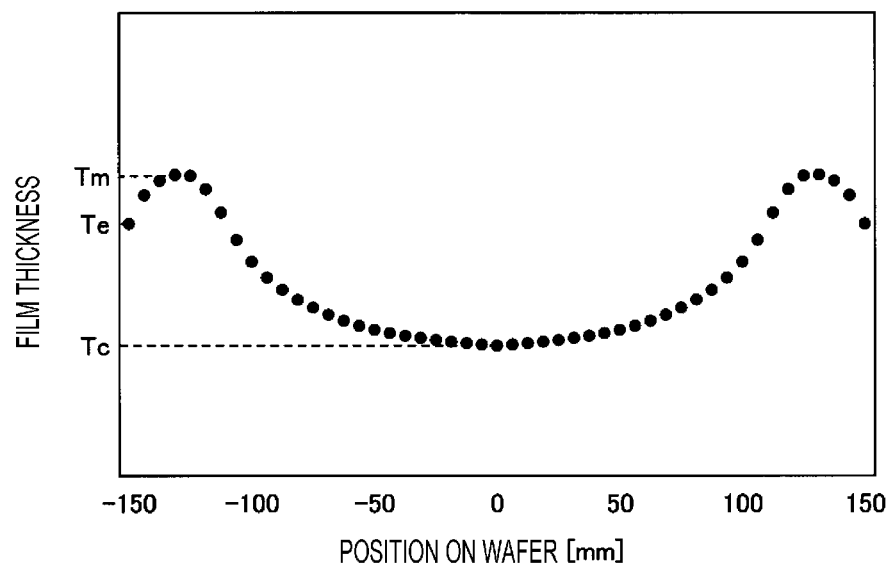
FIG. 6 is a diagram illustrating an example of a relationship between the in-plane position of a wafer and the film thickness.

In a case where the measured film thickness value shows the distribution illustrated in FIG. 6, since the measured film thickness value Tc at the position near the center is less than the measured film thickness value Te at the position near the outer edge and the measured film thickness value Tm at the intermediate position is greater than the measured film thickness value Te at the position near the outer edge, the diagnosis unit 44 diagnoses that the film thickness has an M-shaped in-plane shape. That is, since the measured film thickness values satisfy the relation of Tc<Te<Tm, the diagnosis unit 44 diagnoses that the film thickness has an M-shaped in-plane shape.

Figure 7:
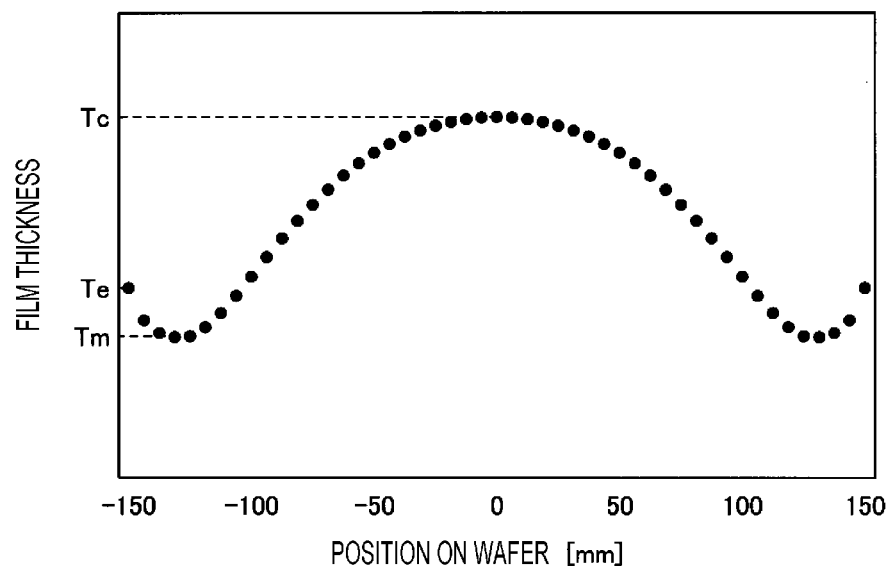
FIG. 7 is a diagram illustrating an example of a relationship between the in-plane position of a wafer and the film thickness.

In a case where the measured film thickness value shows the distribution illustrated in FIG. 7, since the measured film thickness value Tc at the position near the center is greater than the measured film thickness value Te at the position near the outer edge and the measured film thickness value Tm at the intermediate position is less than the measured film thickness value Te at the position near the outer edge, the diagnosis unit 44 diagnoses that the film thickness has a W-shaped in-plane shape. That is, since the measured film thickness values satisfy the relation of Tm<Te<Tc, the diagnosis unit 44 diagnoses that the film thickness has a W-shaped in-plane shape.

Figure 8:
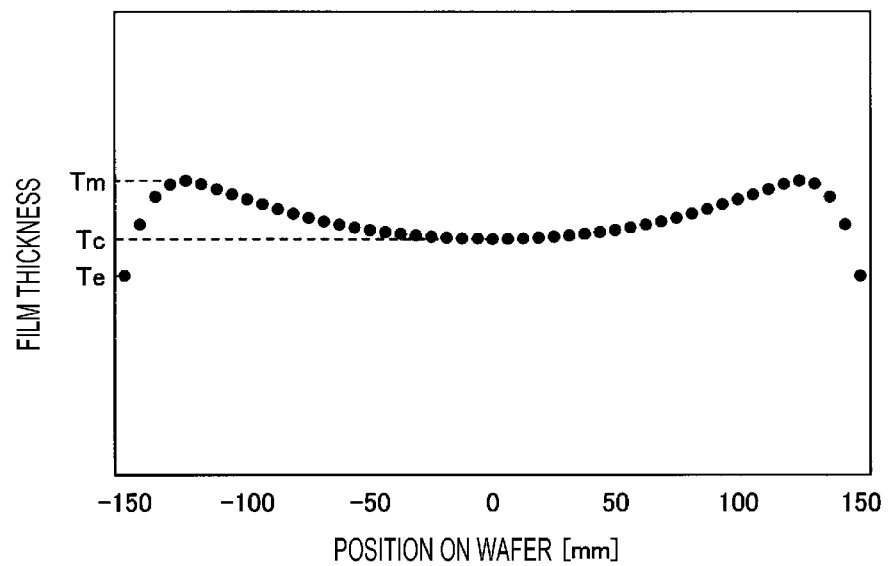
FIG. 8 is a diagram illustrating an example of a relationship between the in-plane position of a wafer and the film thickness.

In a case where the measured film thickness value shows the distribution illustrated in FIG. 8, since the measured film thickness value Tc at the position near the center is greater than the measured film thickness value Te at the position near the outer edge and the measured film thickness value Tm at the intermediate position is greater than the measured film thickness value Te at the position near the outer edge, the diagnosis unit 44 diagnoses that the film thickness has an in-plane shape that is difficult for optimization. That is, since the measured film thickness values satisfy the relation of Te<Tc<Tm, the diagnosis unit 44 diagnoses that the film thickness has an in-plane shape that is difficult for optimization.

Further, for example, the diagnosis unit 44 may create a wafer map based on the measured film thickness values at a plurality of positions in the plane of the wafer, and may diagnose the validity of the in-plane shape of the film thickness based on the wafer map and correspondence information in which the wafer map and the in-plane shape correspond to each other. For example, the diagnosis unit 44 estimates the in-plane shape of the film thickness for the wafer map based on the wafer map and the correspondence information. The wafer map is an image illustrating a relationship between the in-plane position of the wafer and the film thickness.

Further, the diagnosis unit 44 may diagnose the validity of the in-plane shape of the film thickness based on an in-plane uniformity calculated by the first determination unit 43, an in-plane uniformity of the film thickness predicted when a film is formed by a processing recipe optimization-calculated by the optimization processing unit 46, and a target in-plane uniformity.

The second determination unit 45 determines the result of diagnosis by the diagnosis unit 44. For example, the second determination unit 45 determines whether or not the in-plane shape of the film thickness is a predetermined shape. The predetermined shape may be, for example, a convex in-plane shape (see FIG. 4), a concave in-plane shape (see FIG. 5), an M-shaped in-plane shape (see FIG. 6), or a W-shaped in-plane shape (see FIG. 7). When the in-plane shape of the film thickness is the predetermined shape, the second determination unit 45 causes the optimization processing unit 46 to execute a recipe optimization calculation. Meanwhile, when the in-plane shape of the film thickness is not the predetermined shape and is, for example, a shape that is difficult for optimization (see FIG. 8), the second determination unit 45 causes the display device 406 to perform display to make a user take a separate action. The separate action includes, for example, an action that is encouraged to increase the in-plane uniformity of the film thickness (hereinafter referred to as "encouraging action"). In addition, when the in-plane shape of the film thickness is the predetermined shape and when the in-plane uniformity of the predicted film thickness is worse than the in-plane uniformity calculated by the first determination unit 43, the second determination unit 45 may not cause the optimization processing unit 46 to execute a recipe optimization calculation. In this case, the second determination unit 45 causes the display device 406 to perform display to make the user take a separate action, for example, an encouraging action.

The optimization processing unit 46 executes a recipe optimization calculation. In the recipe optimization calculation, the temperature of the wafer which becomes a target in-plane uniformity is calculated based on the measured film thickness value received by the reception unit 41, a temperature-film thickness model stored in the model storage 51, and the actually measured value of the temperature of a heater stored in the log storage 53. At that time, an optimization algorithm such as a linear programming method or a quadratic programming method may be used according to the use purpose thereof. Further, the set temperature of the heater is calculated so as to be the temperature of the wafer calculated by a process model based on a thermal model stored in the model storage 51. Further, the set temperature of the heater is adjusted to prevent the power of the heater from being saturated based on, for example, the set temperature of the heater stored in the recipe storage 52 and the actually measured value of the temperature of the heater and the actually measured value of the power of the heater stored in the log storage 53. Details of the temperature-film thickness model and the thermal model will be described later.

The update unit 47 updates the set temperature of the heater of the processing recipe to the set temperature of the heater calculated by the optimization processing unit 46. The updating of the processing recipe may be overwriting of an existing processing recipe, or may be creation of a new processing recipe separate from the existing processing recipe.

The display control unit 48 notifies the user to take a separate action, for example, an encouraging action. For example, the display control unit 48 displays various messages on the display device 406. The various messages include, for example, information indicating that the target in-plane uniformity is unachievable, information indicating that the in-plane uniformity is the limit of optimization by the recipe optimization calculation, and information indicating an encouraging action. Examples of the encouraging action may include increasing the pressure in a processing container during a film forming processing and narrowing the mounting interval of wafers mounted in the wafer boat.

The third determination unit 49 determines whether or not an operation of continuing a processing has been performed by the user. Further, the third determination unit 49 may determine whether or not a processing has continued based on a predetermined determination criterion instead of the operation by the user.

The execution unit 50 executes the encouraging action notified by the display control unit 48.

The model storage 51 stores a process model and a thermal model. The process model is a model indicating the influence of film forming conditions on the film forming result, and includes, for example, a temperature-film thickness model. The temperature-film thickness model is a model indicating the influence of the temperature of the wafer on the film thickness of a formed film. The thermal model is a model indicating a relationship between the temperature of the wafer and the set temperature of the heater, and is referenced when the set temperature of the heater is determined so as to be the temperature of the wafer calculated by the process model such as the temperature-film thickness model. As for the process model and the thermal model, a case where a default (fixed) value is not optimal according to the film forming conditions or the state of the film forming apparatus 10 is also considered. Therefore, learning of the model may be performed by adding an extended Kalman filter to software to equip a learning function.

The recipe storage 52 stores a processing recipe. The processing recipe determines a control sequence according to the type of a film forming processing executed by the film forming apparatus 10. The processing recipe is prepared for each film forming processing actually performed by the user. The processing recipe defines, for example, film forming conditions such as a temperature change, a pressure change, timing of starting and stopping the supply of various gases, and the supply amount of various gases from the carry-in of the wafer to the film forming apparatus 10 to the carry-out of the completely processed wafer.

The log storage 53 stores the actually measured values (hereinafter referred to as "log information") of the film forming conditions when a film is formed on the wafer.

The log information may include the actually measured values of the film forming conditions such as the temperature of the heater, the power of the heater, the flow rate of a film forming gas, the supply time of the film forming gas, the pressure in the processing container, and the supply time of a purge gas for each predetermined time during film forming (period from the start to the end of a film forming processing).

Control Method

Figure 9:
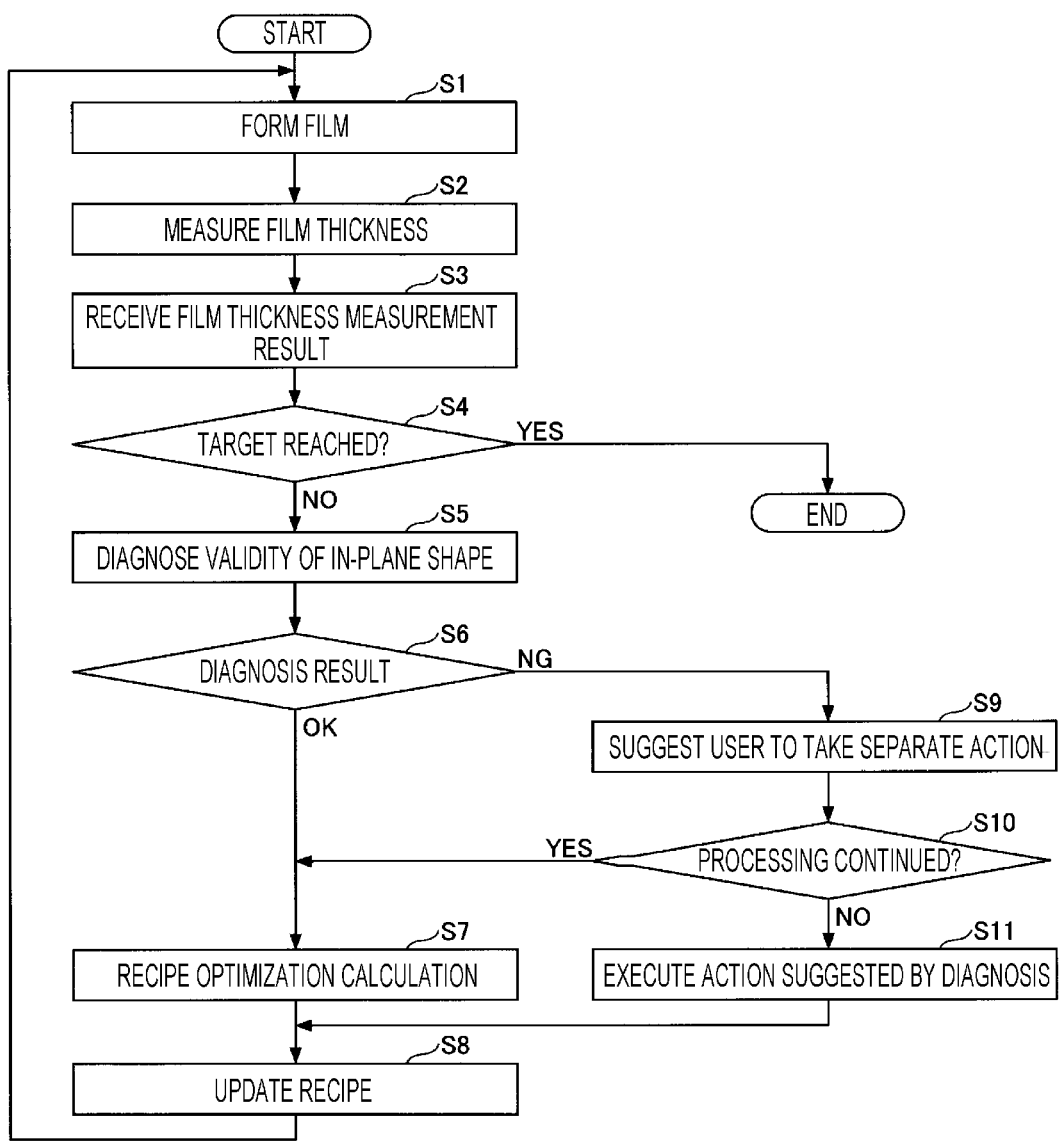
FIG. 9 is a flowchart illustrating an example of an operation of the group management controller according to an embodiment.

An example of a control method executed by the group management controller 40 of an embodiment will be described with reference to FIG. 9. FIG. 9 is a flowchart illustrating an example of an operation of the group management controller 40 according to an embodiment.

First, in step S1, necessary information such as a process type is input, and when a start command is received, the group management controller 40 transmits a signal for causing the film forming apparatus 10 to execute a film forming processing based on a processing recipe corresponding to the input process type. When the signal is received from the group management controller 40, the film forming apparatus 10 performs a film forming processing of forming a film on the wafer.

Next, in step S2, the group management controller 40 transmits a signal for causing the film thickness measuring device 20 to measure the film thickness of the film formed in step S1. When the signal is received from the group management controller 40, the film thickness measuring device 20 measures the film thickness of the film formed on the wafer at a plurality of positions in the plane. The plurality of positions may be, for example, 49 positions.

Next, in step S3, the group management controller 40 receives the film thickness measurement result measured by the film thickness measuring device 20 in step S2. The film thickness measurement result includes, for example, film thickness information in which the in-plane position of the wafer and the measured film thickness value correspond to each other.

Next, in step S4, the group management controller 40 determines whether or not the film thickness measurement result received in step S3 has reached a target. For example, the group management controller 40 calculates in-plane uniformity based on the measured film thickness values at the plurality of positions in the plane received in step S3, and determines that the film thickness measurement result has reached the target when the calculated in-plane uniformity is equal to or less than a predetermined value (for example, ±1%). Meanwhile, the group management controller 40 calculates the in-plane uniformity based on the measured film thickness values at the plurality of positions in the plane received in step S3, and determines that the film thickness measurement result has not reached the target when the calculated in-plane uniformity is greater than the predetermined value (for example, ±1%). In step S4, when it is determined that the film thickness measurement result has reached the target, the group management controller 40 ends the processing. Meanwhile, in step S4, when it is determined that the film thickness measurement result has not reached the target, the group management controller 40 proceeds the processing to step S5.

Next, in step S5, the group management controller 40 diagnoses the validity of the in-plane shape of the film thickness based on the film thickness measurement result received in step S3. For example, the group management controller 40 diagnoses the validity of the in-plane shape of the film thickness based on a magnitude relation of the measured film thickness values at the plurality of positions in the plane of the wafer. The plurality of positions may include, for example, a position near the center and a position near the outer edge in the plane of the wafer, or may even better include a position near the center, a position near the outer edge, and an intermediate position between the position near the center and the position near the outer edge in the plane of the wafer.

Further, for example, the group management controller 40 may create a wafer map based on the measured film thickness values at the plurality of positions in the plane of the wafer, and may diagnose the validity of the in-plane shape of the film thickness based on the wafer map and correspondence information in which the wafer map and the in-plane shape correspond to each other. The wafer map is an image illustrating a relationship between the in-plane position of the wafer and the film thickness. The group management controller 40 estimates the in-plane shape of the film thickness for the wafer map based on the wafer map and the correspondence information.

Further, the group management controller 40 may diagnose the validity of the in-plane shape of the film thickness based on the in-plane uniformity calculated in step S4, the in-plane uniformity of the predicted film thickness when the film is formed by the processing recipe for which the recipe optimization calculation has been executed, and a target in-plane uniformity.

Next, in step S6, the group management controller 40 determines the diagnosis result in step S5. For example, when the in-plane shape of the film thickness is a predetermined shape, the group management controller 40 determines that the diagnosis result is "OK" and proceeds the processing to step S7. The predetermined shape may be, for example, a convex in-plane shape (see FIG. 4), a concave in-plane shape (see FIG. 5), an M-shaped in-plane shape (see FIG. 6), or a W-shaped in-plane shape (see FIG. 7). Meanwhile, when the in-plane shape of the film thickness is not the predetermined shape and is, for example, a shape that is difficult for optimization (see FIG. 8), the group management controller 40 determines that the diagnosis result is "NG" and proceeds the processing to step S9. Further, for example, when the in-plane shape of the film thickness is the predetermined shape, and when the in-plane uniformity of the predicted film thickness is worse than the in-plane uniformity calculated in step S4, the group management controller 40 may determine that the diagnosis result is "NG", and may proceed the processing to step S9.

Next, in step S7, the group management controller 40 executes a recipe optimization calculation. In the recipe optimization calculation, the temperature of the wafer which becomes the target in-plane uniformity is calculated based on the measured film thickness value received in step S3, the temperature-film thickness model stored in the model storage 51, and the actually measured value of the temperature of the heater stored in the log storage 53. At that time, an optimization algorithm such as a linear programming method or a quadratic programming method may be used according to the use purpose thereof. Further, the set temperature of the heater is calculated so as to be the temperature of the wafer calculated by the process model based on the thermal model stored in the model storage 51. Further, the set temperature of the heater is adjusted to prevent the power of the heater from being saturated based on, for example, the set temperature of the heater stored in the recipe storage 52 and the actually measured value of the temperature of the heater and the actually measured value of the power of the heater stored in the log storage 53.

Next, in step S8, the group management controller 40 updates the set temperature of the heater of the read processing recipe to the set temperature of the heater calculated in step S7, and returns the processing to step S1. The updating of the processing recipe may be overwriting of an existing processing recipe, or may be creation of a new processing recipe separate from the existing processing recipe.

Next, in step S9, the group management controller 40 notifies the user to take a separate action, for example, an encouraging action. For example, the group management controller 40 displays various messages on the display device 406. The various messages include, for example, information indicating that the target in-plane uniformity is unachievable, information indicating that the in-plane uniformity is the limit of optimization by the recipe optimization calculation, and information indicating an encouraged action.

Next, in step S10, the group management controller 40 determines whether or not an operation of continuing the processing has been performed by the user. When the operation of continuing the processing is performed by the user, the group management controller 40 proceeds the processing to step S7 and executes a recipe optimization calculation. Meanwhile, when an operation of not continuing the processing is performed by the user, the group management controller 40 proceeds the processing to step S11. In step S10, instead of an operation by the user, the group management controller 40 may determine whether or not to continue the processing based on a predetermined determination criterion.

Next, in step S11, the group management controller 40 executes the encouraged action notified in step S9, and proceeds the processing to step S8. In step S11, instead of the group management controller 40, the user may execute an encouraging action, and may proceed the processing to step S8.

As described above, according to the embodiment, the group management controller 40 diagnoses the validity of the in-plane shape of the film thickness, and based on the diagnosis result, determines whether to perform an optimization processing or to notify the user to take an encouraging action. Thus, the user may easily perform condition setting for enhancing the in-plane uniformity even when the processing recipe may not be optimized by an optimization processing. As a result, the time for condition setting may be shortened, and the operation rate of the device may be improved. In addition, the number of condition settings may be reduced, and various costs such as human cost, wafer cost, gas cost, and power cost may be reduced.

In the above-described embodiment, the group management controller 40 is an example of a control device, and the wafer map is an example of a substrate map.

In the above-described embodiment, a case where the group management controller 40 executes the control method has been described as an example, but the present disclosure is not limited thereto. For example, the apparatus controller 12, the terminal 60, and the host computer may execute the control method.

In the above-described embodiment, the film thickness of the formed film has been described as an example, but the present disclosure is not limited thereto. For example, other film characteristics such as the impurity concentration, sheet resistance, and reflectivity of the formed film may be used.

In the above-described embodiment, a case where a substrate is a semiconductor wafer has been described, but the present disclosure is not limited thereto. For example, a substrate may be a large substrate for a flat panel display (FPD), a substrate for an organic EL panel, or a substrate for a solar cell.

According to the present disclosure, condition setting for increasing in-plane uniformity may be easily performed.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A control device comprising:
   a measuring device for obtaining a plurality of measurements of a film characteristic of a film formed on a substrate based on a processing recipe, the plurality of measurements including measurements of the film characteristic at a plurality of positions along a plane of the substrate extending between edges of the substrate through a center of the substrate, the plurality of positions along the plane of the substrate;
   diagnosis circuitry in communication with the measuring device, and configured to: 1) map the plurality of measurements of the film characteristic received from the measuring device into an in-plane shape on a substrate map, the in-plane shape extending between the edges of the substrate through the center of the substrate; 2) diagnose a validity of the in-plane shape on the substrate map by analyzing a magnitude relation between at least two measurements of the film characteristic at the plurality of positions along the plane of the substrate; and 3) determine whether the in-plane shape belongs to one of a plurality of predetermined shapes or not;
   optimization processing circuitry for: 1) receiving the diagnosed validity of the in-plane shape from the substrate map, from the diagnosis circuitry, and 2) in response to the in-plane shape belonging to one of the plurality of predetermined shapes, providing an optimization calculation for film forming processing on the substrate including a subsequent processing recipe; and
   operation control circuitry for controlling the film forming processing based on the optimization calculation.

2. The control device according to claim 1, wherein the plurality of positions include the center or proximate to the center of the substrate, the edges of the substrate, and positions intermediate to the center and one of the respective edges, along the plane of the substrate.

3. The control device according to claim 1, wherein the diagnosis circuitry diagnoses the validity of the in-plane shape based on an in-plane uniformity of the film characteristic, the in-plane uniformity of the film characteristic predicted when the film is formed by the processing recipe for which the optimization calculation has been executed, and a target in plane uniformity of the film characteristic.

4. The control device according to claim 1, wherein the optimization processing circuitry executes the optimization calculation of the processing recipe based on the plurality of measurements of the film characteristic and a model indicating an influence of a temperature of the substrate on the film characteristic.

5. The control device according to claim 1, further comprising:
   determination circuitry configured to determine whether or not to notify a user of an encouraging action based on a diagnosis result by the diagnosis circuitry.

6. The control device according to claim 5, further comprising:
   display control circuitry configured to notify the user of the encouraging action.

7. The control device according to claim 6, further comprising:
   execution circuitry configured to execute the encouraging action notified by the display control circuitry.

8. The control device according to claim 1, wherein the film characteristic is a film thickness.

9. A system comprising:
   a film forming apparatus including a processing chamber configured to execute a film forming processing on a substrate based on a processing recipe;
   a measuring meter configured to measure and provide a plurality of measurements of a film characteristic of a film formed on the substrate, along a plane of the substrate, on which the film forming processing has been executed; and
   a controller in communication with the film forming apparatus, and the measuring meter, the controller comprising:
   diagnosis circuitry configured to: 1) receive the plurality of measurements from the measuring meter and map the plurality of measurements into an in-plane shape on a substrate map from a plurality of positions along the plane of the substrate extending between edges of the substrate through the center of the substrate, 2) diagnose a validity of an in-plane shape of the film characteristic from the substrate map by analyzing a magnitude relation between at least two of the plurality of measurements at the plurality of positions along the plane of the substrate; and 3) determine whether the in-plane shape belongs to one of a plurality of predetermined shapes or not;

optimization processing circuitry for: I) receiving the diagnosed validity of the in plane shape from the substrate map, from the diagnosis circuitry, and 2) in response to the in-plane shape belonging to one of the plurality of predetermined shapes, providing an optimization calculation including a subsequent processing recipe for film forming processing on the substrate; and operation control circuitry for controlling the film forming processing by the film forming apparatus, based on the optimization calculation.

10. A control method comprising:

receiving a measurement of a film characteristic at a plurality of positions, to obtain a plurality of measurements, taken along a plane of a substrate between edges of the substrate and extending through a center of the substrate, of a film formed on the substrate by a film forming processing based on a processing recipe;

mapping the plurality of measurements of the film characteristic at the plurality of positions into an in-plane shape on a substrate map;

diagnosing a validity of the in-plane shape of the film characteristic from the substrate map by analyzing a magnitude relation between at least two of the plurality of measurements at the plurality of positions along the plane of the substrate;

receiving the diagnosed validity of the in-plane shape of the film characteristic from the substrate map;

determining whether the in-plane shape belongs to one of a plurality of predetermined shapes or not;

in response to the in-plane shape belonging to one of the predetermined shapes, executing an optimization calculation including a subsequent processing recipe for film forming processing on the substrate; and controlling the film forming processing based on the optimization calculation.

11. The control device according to claim 1, wherein the processing recipe and the subsequent processing recipe are either: 1) a same processing recipe, or 2) different processing recipes.

12. The system according to claim 9, wherein the processing recipe and the subsequent processing recipe are either: 1) a same processing recipe, or 2) different processing recipes.

13. The control method according to claim 10, wherein the processing recipe and the subsequent processing recipe are either: 1) a same processing recipe, or 2) different processing recipes.

14. The control device according to claim 1, wherein the plurality of positions, for analyzing the magnitude relation between at least two measurements, include predetermined positions along the plane of the substrate.

* * * * *